US012606935B2

(12) United States Patent
Tsuchiya et al.

(10) Patent No.: US 12,606,935 B2
(45) Date of Patent: Apr. 21, 2026

(54) SILICON SINGLE CRYSTAL SUBSTRATE FOR VAPOR PHASE GROWTH, VAPOR PHASE GROWTH SUBSTRATE AND METHODS FOR PRODUCING THEM

(71) Applicant: SHIN-ETSU HANDOTAI CO., LTD., Tokyo (JP)

(72) Inventors: Keitaro Tsuchiya, Takasaki (JP); Masaru Shinomiya, Annaka (JP); Weifeng Qu, Takasaki (JP)

(73) Assignee: SHIN-ETSU HANDOTAI CO., LTD, Tokyo (JP)

( * ) Notice: Subject to any disclaimer, the term of this patent is extended or adjusted under 35 U.S.C. 154(b) by 649 days.

(21) Appl. No.: 17/918,713

(22) PCT Filed: Mar. 23, 2021

(86) PCT No.: PCT/JP2021/011845
§ 371 (c)(1),
(2) Date: Oct. 13, 2022

(87) PCT Pub. No.: WO2021/210354
PCT Pub. Date: Oct. 21, 2021

(65) Prior Publication Data
US 2023/0235481 A1      Jul. 27, 2023

(30) Foreign Application Priority Data
Apr. 17, 2020    (JP) ................................ 2020- 073795

(51) Int. Cl.
C30B 31/06 (2006.01)
C30B 25/18 (2006.01)
(Continued)

(52) U.S. Cl.
CPC ............ C30B 33/02 (2013.01); C30B 25/186 (2013.01); C30B 29/06 (2013.01); C30B 29/406 (2013.01); H10D 62/8503 (2025.01); C30B 13/00 (2013.01)

(58) Field of Classification Search
CPC ......... C30B 13/00; C30B 13/30; C30B 13/34; C30B 28/08; C30B 29/06; C30B 29/38;
(Continued)

(56) References Cited

U.S. PATENT DOCUMENTS

2007/0252239 A1    11/2007  Maeda et al.
2016/0060786 A1*    3/2016  Niederer ............... C30B 13/285
                                                           117/37
2020/0216975 A1*    7/2020  Basak ..................... C30B 15/10

FOREIGN PATENT DOCUMENTS

CN            1943022 A        4/2007
JP       2007-176725 A        7/2007
(Continued)

OTHER PUBLICATIONS

Translation WO 2021005872 (Year: 2021).*
(Continued)

*Primary Examiner* — Hoa (Holly) Le
(74) *Attorney, Agent, or Firm* — Oliff PLC

(57) ABSTRACT

A silicon single crystal substrate for vapor phase growth, having the silicon single crystal substrate being made of an FZ crystal having a resistivity of 1000 $\Omega$cm or more, wherein the surface of the silicon single crystal substrate is provided with a high nitrogen concentration layer having a nitrogen concentration higher than that of other regions and a nitrogen concentration of $5 \times 10^{15}$ atoms/cm$^3$ or more and a thickness of 10 to 100 $\mu$m.

6 Claims, 2 Drawing Sheets

10

(51) Int. Cl.

| | |
|---|---|
| *C30B 29/06* | (2006.01) |
| *C30B 29/40* | (2006.01) |
| *C30B 33/02* | (2006.01) |
| *H10D 62/85* | (2025.01) |
| *C30B 13/00* | (2006.01) |

(58) Field of Classification Search
CPC ......... C30B 29/60; C30B 29/64; C30B 31/06;
C30B 33/02
See application file for complete search history.

(56) References Cited

FOREIGN PATENT DOCUMENTS

| | | | | | |
|---|---|---|---|---|---|
| JP | 2011054656 | A | * | 3/2011 | ............ C30B 15/00 |
| JP | 2012-079952 | A | | 4/2012 | |
| JP | 2012-151401 | A | | 8/2012 | |
| JP | 2016-111044 | A | | 6/2016 | |
| WO | 2005/010243 | A1 | | 2/2005 | |
| WO | WO-2020129540 | A1 | * | 6/2020 | ....... H01L 21/02381 |
| WO | WO-2021005872 | A1 | * | 1/2021 | ........... C30B 25/186 |
| WO | WO-2021129270 | A1 | * | 7/2021 | ............ C30B 23/00 |

OTHER PUBLICATIONS

Translation JP 2011054656 A (Year: 2011).*
Aug. 9, 2023 Office Action issued in Chinese Patent Application No. 202180028335.2.
May 3, 2024 Search Report issued in European Patent Application No. 21787666.3.
Chiu, Hsien-chin et al.; "Sidewall defects of AlGaN/GaN HEMTs evaluated by low frequency noise analysis"; Microelectrics Reliability: An Internet Journal & World Abstracting Service; vol. 53; No. 12; pp. 1897-1900.
Topsil Semiconducter Materials; "High Resistivity, Nitrogen-Enriched FZ SI Wafers For Particle Detectors"; <www.nitrosil. com;> Jan. 1, 2016.
Oct. 13, 2022 International Preliminary Report on Patentability issued in International Patent Application No. PCT/JP2021/011845.
May 25, 2021 International Search Report issued in International Application No. PCT/JP2021/011845.

* cited by examiner

[FIG. 1]
<u>10</u>
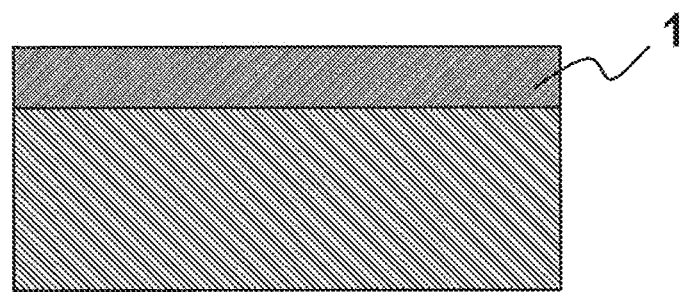
[FIG. 2]
<u>20</u>
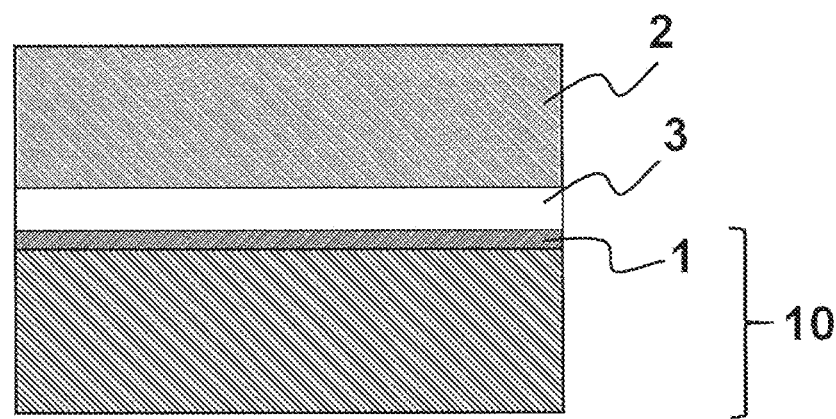
[FIG. 3]
<u>30</u>
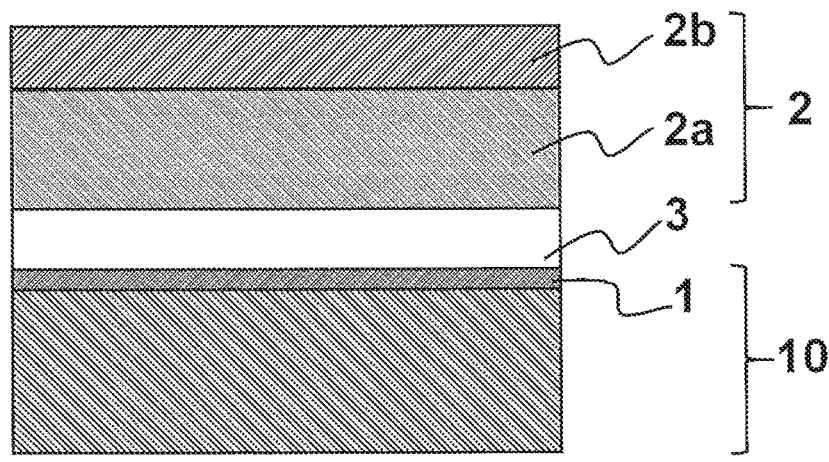

[FIG. 4]
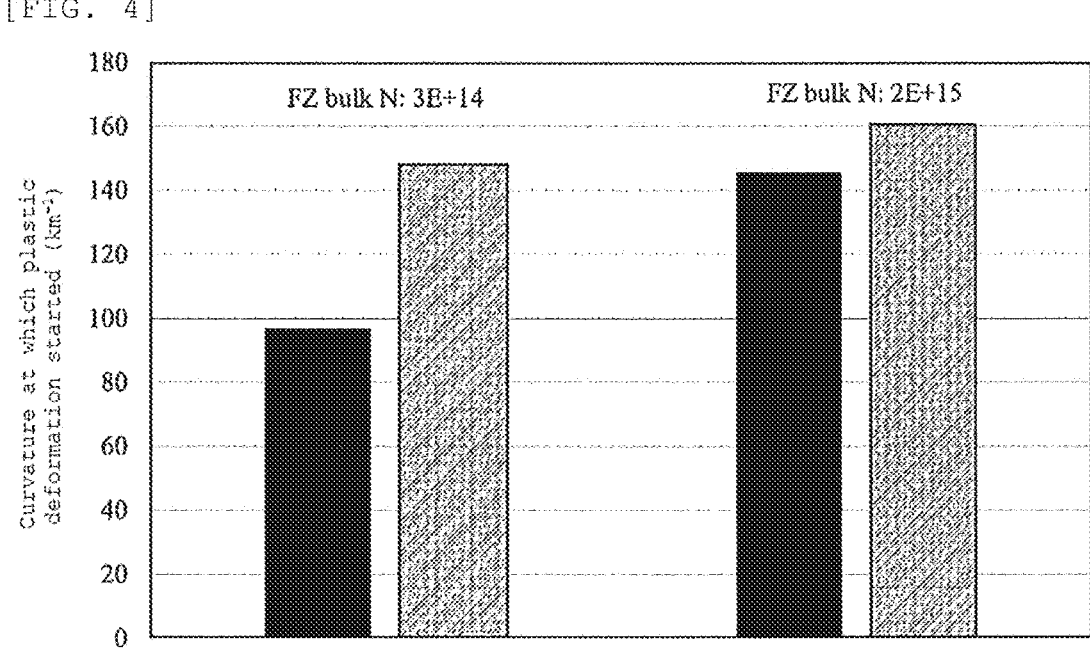

SILICON SINGLE CRYSTAL SUBSTRATE FOR VAPOR PHASE GROWTH, VAPOR PHASE GROWTH SUBSTRATE AND METHODS FOR PRODUCING THEM

TECHNICAL FIELD

The present invention relates to a silicon single crystal substrate for vapor phase growth, a vapor phase growth substrate, and methods for producing them.

BACKGROUND ART

High frequency devices are being developed to integrate devices such as antennas, amplifiers, switches, and filters in order to reduce the size and cost. Further, as the frequency becomes higher, the circuit becomes more complicated, and the materials of the devices used are various such as silicon CMOS, devices using III-V semiconductors and nitride semiconductors, and filters using piezoelectric materials.

As a substrate used as the base of these devices, it is considered that a silicon single crystal substrate, which is inexpensive and has a large diameter wafer on the market, is suitable. In particular, as the substrate for the high frequency devices, a silicon single crystal substrate (also referred to as "FZ substrate") made of FZ crystals produced by the FZ (Floating-Zone) method, which has high resistivity and shows little change in resistivity due to thermal donor, is considered suitable.

However, the high resistivity FZ substrate has poor mechanical properties as compared with a low resistivity CZ substrate, and has a problem that plastic deformation is likely to occur due to the propagation of dislocations. In particular, in the growth of GaN on a silicon single crystal substrate, since the stress due to the difference in lattice constant and the difference in thermal expansion coefficient tends to cause an increase in warpage and plastic deformation, stress reduction is performed by the growth conditions and the relaxation layer.

For example, in Patent Document 1, stress relaxation is performed by using an intermediate layer of gallium nitride based compound semiconductors that are periodically laminated a plurality of layers, and a wafer having small warpage and cracks is produced.

CITATION LIST

Patent Literature

Patent Document 1: JP 2012-79952 A

SUMMARY OF INVENTION

Technical Problem

However, in the technique described in Patent Document 1, there is a concern that the growth time becomes long and the degree of freedom in design is reduced by producing a complicated intermediate layer.

Further, particularly in high frequency devices, it is necessary to reduce the parasitic capacitance of the device, its supporting substrate, and peripheral packages in order to improve the high frequency characteristics. In order to reduce the parasitic capacitance, if a high resistivity FZ silicon single crystal substrate that does not generate thermal donor is used as a support substrate or a package, it is considered that the characteristics are improved and there is a merit in terms of cost.

On the other hand, the device manufacturing process includes steps such as epitaxial growth on a substrate, heat treatment, and bonding, and in the process, stress is generated in the substrate due to the difference in lattice constant and the difference in thermal expansion coefficient between different materials. However, the FZ substrate has a demerit that the Young's modulus at the time of first dislocation generation is low and plastic deformation is likely to occur as compared with a normal low resistivity CZ substrate. When plastic deformation occurs, the wafer is greatly distorted and its shape cannot be restored, which may cause warpage abnormality or bonding failure.

It is conceivable to increase the nitrogen concentration of the FZ substrate to improve the mechanical properties, but there has been a problem that it is difficult to obtain a single crystal with a high nitrogen concentration in the bulk in the production of a silicon single crystal by the FZ method, and the yield is low.

The present invention has been made to solve the above problems, it is an object of the present invention to provide a silicon single crystal substrate for vapor phase growth, which is difficult to be plastically deformed, a vapor phase growth substrate with the plastic deformation suppressed and methods for producing them in order to suppress the occurrence of warpage abnormality and bonding failure.

Solution to Problem

The present invention has been made to achieve the above object, and provides a silicon single crystal substrate for vapor phase growth, comprising the silicon single crystal substrate being made of an FZ crystal having a resistivity of 1000 $\Omega$cm or more, wherein the surface of the silicon single crystal substrate is provided with a high nitrogen concentration layer having a nitrogen concentration higher than that of other regions and a nitrogen concentration of $5 \times 10^{15}$ atoms/cm$^3$ or more a thickness of 10 to 100 $\mu$m.

A silicon single crystal substrate for vapor phase growth composed of such a high resistivity FZ crystal is suitable for a substrate for high frequency devices because the parasitic capacitance is reduced. Since it contains a high concentration of nitrogen at the surface of the substrate, it has excellent mechanical properties. When forming a vapor phase growth layer of a semiconductor single crystal, plastic deformation is unlikely to occur, and the occurrence of warpage abnormality and bonding failure is suppressed.

At this time, a vapor phase growth substrate can be the silicon single crystal substrate having a vapor phase growth layer of a semiconductor single crystal on it.

Such a vapor phase growth substrate is suitable for high frequency devices, and since the surface of the substrate for vapor phase growth contains a high concentration of nitrogen, plastic deformation is suppressed, and occurrence of warpage abnormality and bonding failure is suppressed.

At this time, the vapor phase growth substrate can have a vapor phase growth layer of the semiconductor single crystal containing a nitride semiconductor.

This makes the substrate more suitable for high frequency devices. Further, in particular, the effect of the present invention is remarkable in a vapor phase growth substrate in which a nitride semiconductor such as GaN is formed on a silicon single crystal substrate, which is prone to increase in warpage and plastic deformation due to stress due to a difference in lattice constant and a difference in thermal expansion coefficient.

The present invention also provides a method for producing a silicon single crystal substrate for vapor phase growth, wherein a silicon single crystal substrate having a resistivity of 1000 Ωcm or more manufactured by the FZ method is subjected to RTA treatment in a nitrogen-containing gas atmosphere, to form a high nitrogen concentration layer having a nitrogen concentration higher than that of other regions and a nitrogen concentration of $5\times10^{15}$ atoms/cm$^3$ or more and a thickness of 10 to 100 μm at the surface of the silicon single crystal substrate.

According to such a method for producing a substrate for vapor phase growth, the substrate for vapor phase growth, that is suitable for a substrate for a high frequency device, has excellent mechanical properties due to the surface of a silicon single crystal substrate for vapor phase growth contains a high concentration of nitrogen, and the substrate for vapor phase growth is resistant to plastic deformation when forming a vapor phase growth layer of a semiconductor single crystal and can suppress the occurrence of warpage abnormality and bonding failure, can be produced easily.

At this time, it can be a method for producing a vapor phase growth substrate, in which a semiconductor single crystal layer is vapor phase deposited on the substrate for vapor phase growth produced by the above mentioned method for producing a substrate for vapor phase growth.

This makes it possible to easily produce a vapor phase growth substrate in which warpage and plastic deformation are suppressed.

At this time, it can be the method for producing a vapor phase growth substrate in which the semiconductor single crystal layer contains a nitride semiconductor.

This makes it possible to easily produce a vapor phase growth substrate in which warpage and plastic deformation are suppressed, which is extremely suitable for producing a high frequency device.

Advantageous Effects of Invention

As described above, according to the silicon single crystal substrate for vapor phase growth of the present invention, it is suitable for a substrate for high frequency devices because the parasitic capacitance is reduced, and has excellent mechanical properties, and when the vapor phase growth layer of a semiconductor single crystal is formed, it is difficult to be plastically deformed, and it is possible to suppress the occurrence of abnormal warpage and bonding failure. Further, according to the method for producing a silicon single crystal substrate for vapor phase growth of the present invention, that is suitable for a substrate for a high frequency device, and the substrate for vapor phase growth is resistant to plastic deformation when forming a vapor phase growth layer of a semiconductor single crystal and can suppress the occurrence of warpage abnormality and bonding failure, can be produced easily.

BRIEF DESCRIPTION OF DRAWINGS

FIG. 1 shows a conceptual diagram of a silicon single crystal substrate for vapor phase growth according to the present invention.

FIG. 2 shows a conceptual diagram of a vapor phase growth substrate according to the present invention.

FIG. 3 shows a conceptual diagram of another example (HEMT) of a vapor phase growth substrate according to the present invention.

FIG. 4 shows a comparison of the curvatures of the epitaxial substrates according to Examples 1 and 2 and Comparative Examples 1 and 2 at which plastic deformation starts.

DESCRIPTION OF EMBODIMENTS

Hereinafter, the present invention will be described in detail, but the present invention is not limited thereto.

As described above, in order to suppress the occurrence of warpage abnormality and bonding failure, a silicon single crystal substrate for vapor phase growth that is hard to be plastically deformed has been required.

As a result of diligent studies on the above problems, the inventors of the present invention have found that a silicon single crystal substrate for vapor phase growth, comprising the silicon single crystal substrate being made of an FZ crystal having a resistivity of 1000 Ωcm or more, wherein the surface of the silicon single crystal substrate is provided with a high nitrogen concentration layer having a nitrogen concentration higher than that of other regions and a nitrogen concentration of $5\times10^{15}$ atoms/cm$^3$ or more and a thickness of 10 to 100 μm, is suitable for substrates for high frequency devices since the substrate reduces parasitic capacitance, and because the surface of the substrate contains a high concentration of nitrogen, it has excellent mechanical properties when a vapor phase growth layer of semiconductor single crystals is formed, plastic deformation unlikely to occur, and the occurrence of warpage abnormality and bonding failure is suppressed and completed the present invention.

The inventors of the present invention also have found that a method for producing a silicon single crystal substrate for vapor phase growth, wherein a silicon single crystal substrate having a resistivity or 1000 Ωcm or more manufactured by the FZ method is subjected to RTA treatment in a nitrogen-containing gas atmosphere, to form a high nitrogen concentration layer having a nitrogen concentration higher than that of other regions and a nitrogen concentration of $5\times10^{15}$ atoms/cm$^3$ or more and a thickness of 10 to 100 μm at the surface of the silicon single crystal substrate, that is suitable for a substrate for a high frequency device, and the surface of the silicon single crystal substrate for vapor phase growth contains a high concentration of nitrogen, it has excellent mechanical properties, when a vapor phase growth layer of semiconductor single crystals is formed, it is resistant to plastic deformation and it can suppress the occurrence of warpage abnormality and bonding failure, can be produced easily and completed the present invention.

Hereinafter, an embodiment of a silicon single crystal substrate for vapor phase growth, a vapor phase growth substrate, and methods for producing them according to the present invention will be described with reference to FIGS. 1 to 3.

(Silicon Single Crystal Substrate for Vapor Phase Growth)

FIG. 1 shows a conceptual diagram of a silicon single crystal substrate for vapor phase growth according to the present invention. As the silicon single Crystal substrate 10 for vapor phase growth according to the present invention, in order to reduce the leakage current through the substrate, a single crystal ingot manufactured by the FZ method, which is less affected by the thermal donor, is sliced into a wafer shape, and a silicon single crystal substrate composed of a FZ crystal and having a resistivity of 1000 Ωcm or more is used. Here, the upper limit of the resistivity of the silicon single crystal substrate is not particularly limited, but may be, for example, 10 kΩcm or less. Further, the silicon single crystal substrate 10 for vapor phase growth according to the present invention has a high nitrogen concentration layer 1 at the front surface, which has higher nitrogen concentration than that of other regions (bulk or back surface), and the nitrogen concentration is $5\times10^{15}$ atoms/cm$^3$ or more, and the thickness of the high nitrogen concentration layer 1 is 10 to 100 μm. The upper limit of the nitrogen concentration of the high nitrogen concentration layer 1 can be $5\times10^{16}$ atoms/cm$^3$. Further, a plurality of high nitrogen concentration layers 1 may be formed by changing the concentration. A trap-rich layer that degrades the carrier lifetime may be formed on the surface of the silicon single crystal substrate 10.

(Vapor Phase Growth Substrate)

FIG. 2 shows a conceptual diagram of a vapor phase growth substrate according to the present invention. The vapor phase growth substrate 20 according to the present invention has the vapor phase growth layer 2 of the semiconductor single crystal on the high nitrogen concentration layer 1 of the silicon single crystal substrate 10. The vapor phase growth layer 2 is formed by vapor phase growth such as a thermal CVD method, a MOVPE method, an MBE method, a vacuum vapor deposition method, and a sputtering method, and functions as a device layer, for example.

The composition, film thickness, or the like of the vapor phase growth layer 2 of the semiconductor single crystal are not particularly limited. For example, silicon thin film, silicon carbide, and nitride (group III-V semiconductors such as GaN, AlN, InN, AlGaN, InGaN, AlInN, and AlSeN can be used. The film thickness can be, for example, 1 to 10 μm, and can be designed according to the device.

Further, an shown in FIG. 2, an intermediate layer 3 may be provided. The intermediate layer 3 functions as a buffer layer inserted for improving the crystallinity of the device layer and controlling the stress. The intermediate layer 3 may be omitted when there is no need to improve stress or crystallinity, such as silicon homo-epitaxial. On the other hand, due to the configuration of a device such as a high frequency filter, it may be made of a metal that can be used as a sacrificial layer for creating a spacer or an electrode.

FIG. 3 shows a conceptual diagram of another example of a vapor phase growth substrate 30 according to the present invention. For example, in the high mobility transistor (HEMT) structure shown in FIG. 3, the vapor phase growth layer 2 that functions as a device layer is composed of a gallium nitride 2a and an electron supply layer 2b made of AlGaN formed on the gallium nitride 2a. The vapor phase growth layer 2 is preferably a crystal having few crystal defects and few impurities such as carbon and oxygen in order to improve device characteristics.

Gallium nitride has a lattice constant difference of 17% and a thermal expansion coefficient difference of 116% from that of a silicon (111) single crystal, and stress is applied to a thin film or a substrate during the growth at a high temperature. Further, since the wafer is usually heated to 1000° C. or higher during the growth, when the wafer is stressed, it does not break brittlely and exhibits ductility, causing dislocations and plastic deformation.

The silicon single crystal substrate according to the present invention is suitable as a substrate for high frequency devices because the parasitic capacitance reduced. Further, since the surface of the substrate contains a high concentration of nitrogen, it has excellent mechanical properties.

Therefore, when forming a vapor phase growth layer of a semiconductor single crystal, it is possible to prevent the propagation of dislocations of the silicon single crystal substrate and prevent plastic deformation. Then, by preventing the plastic deformation, it is possible to reduce the warp abnormality and improve the yield. In addition, since the substrate can withstand stress, the film thickness of the vapor phase growth layer can be increased, and the degree of freedom in device design is improved.

(Method for Producing a Silicon Single Crystal Substrate for Vapor Phase Growth)

In the silicon single crystal substrate 10 for vapor phase growth as described above, first, a silicon single crystal ingot having a resistivity of 1000 Ωcm or more is manufactured by the FZ method, and the ingot is sliced into wafers to form a silicon single crystal substrate. The substrate is produced by a method of injecting nitrogen by performing RTA (Rapid Thermal Annealing) treatment in a nitrogen-containing gas atmosphere such as ammonia gas. The conditions for the RTA treatment are not particularly limited, and may be any conditions as long as the nitrogen concentration and thickness of the high nitrogen concentration layer 1 are within the above ranges.

When the above treatment is performed, a silicon nitride layer by RTA treatment is formed on the high nitrogen concentration layer 1, and this silicon nitride layer can be removed by etching or polishing. In the next step, it is essential to remove the nitride layer by etching or polishing on the side where the intermediate layer or the vapor phase growth layer of the semiconductor single crystal is formed, but the silicon nitride layer may remain on the back surface and the edge surface, or it may be removed. Further, when the trap-rich layer is formed, the method for forming the trap-rich layer is not particularly limited, but it can be formed by ion implantation or irradiation with ionizing radiation such as electron beam, X-ray, and γ-ray.

(Method for Producing a Vapor Phase Growth Substrate)

The vapor phase growth substrate 20 according to the present invention can be produced by performing vapor phase growth, such as thermal CVD method, MOVPE method, MBE method, vacuum vapor deposition method, and sputtering method, a semiconductor single crystal vapor phase growth layer 2 on the high nitrogen concentration layer 1 of the silicon single crystal substrate 10 via an intermediate layer 3 if necessary. In the above-mentioned HEMT example, when GaN or AlGaN is formed as the vapor phase growth layer 2, it can be produced at a growth temperature of 900° C. to 1350° C. by using, for example, the MOVPE method. These vapor phase growth conditions may be carried out under generally used conditions.

EXAMPLE

Hereinafter, the present invention will be specifically described with reference to examples, but this does not limit the present invention.

First, two types of wafers, which were silicon single crystal substrates composed of FZ crystals having a diameter of 6 inches (150 mm), a plane orientation (111), and a resistivity of 1000 Ωcm or more, and having different nitrogen concentrations, were prepared. As a result of analyzing each nitrogen concentration by FT-IR and SIMS measurement, the substrate having a low nitrogen concentration was $3.0\times10^{14}$ atoms/cm$^3$, and the substrate having a high nitrogen concentration was $2.0\times10^{15}$ atoms/cm$^3$.

Example 1

A silicon single crystal substrate having a nitrogen concentration of $3.0\times10^{14}$ atoms/cm$^3$ was used, and nitrogen was injected into the surface layer by heat treatment by the RTA method. The RTA treatment conditions were 1250° C. and 10 sec in an $NH_3$ and Ar atmosphere, and a high nitrogen concentration layer having a nitrogen concentration of $5\times10^{15}$/$cm^3$ and a thickness of 38 μm was formed at the surface layer of the silicon single crystal substrate. After the RTA treatment, the silicon nitride film was removed by HF cleaning. Then, GaN, as a nitride semiconductor, was epitaxially grown by the MOVPE method. An epitaxial layer having a total film thickness of 4.5 μm was grown at a growth temperature of 1000 to 1200° C. For epitaxial growth, the growth substrates prepared in each of Example 1, Example 2 and Comparative Examples 1 and 2 described below were carried out in the same MOVPE furnace.

Example 2

An epitaxial layer of GaN, as a nitride semiconductor, was formed in the same manner as in Example 1 except that a silicon single crystal substrate having a nitrogen concentration of $2.0\times10^{15}$ atoms/$cm^3$ was used.

Comparative Example 1

Using the same silicon single crystal substrate as in Example 1, an epitaxial layer was formed without performing RTA treatment (without forming a high nitrogen concentration).

Comparative Example 2

Using the same silicon single crystal substrate as in Example 2, an epitaxial layer was formed without performing RTA treatment (without forming a high nitrogen concentration layer).

Evaluation

For the vapor phase growth substrates of Examples 1 and 2 and Comparative Examples 1 and 2 in which the epitaxial layer was formed as described above, the curvatures at which plastic deformation started were compared. For this evaluation, EpiCurve TT manufactured by LAYTEC was used as a measuring device, and the curvature of the wafer during the growth was measured by incident two laser beams in parallel into the chamber and changing the position of the reflected laser spot.

The results are shown in FIG. 4. As shown in FIG. 4, it was found that regardless of the nitrogen concentration in the bulk, by performing the RTA treatment to form a high nitrogen concentration layer, the curvature at which plastic deformation started during the vapor phase growth of the semiconductor single crystal layer became large and the yield stress became large. In particular, a large improvement was seen in the samples with low bulk nitrogen concentration.

The present invention is not limited to the above embodiment. The above-described embodiment is an example, and any examples having substantially the same structure and having the same effect as the technical idea described the claims of the present invention are included in the technical scope of the present invention.

The invention claimed is:

1. A silicon single crystal substrate for vapor phase growth,
   comprising the silicon single crystal substrate being made of an FZ crystal having a resistivity of 1000 Ωcm or more,
   wherein the surface of the silicon single crystal substrate is provided with a high nitrogen concentration layer having a nitrogen concentration higher than that of the bulk or back surface of the substrate and a nitrogen concentration of $5\times10^{15}$ atoms/$cm^3$ or more and a thickness of 10 to 100 μm, wherein the high nitrogen concentration layer is adjacent to the bulk.

2. A vapor phase growth substrate, wherein a vapor phase growth layer of a semiconductor single crystal is provided on the silicon single crystal substrate according to claim 1.

3. The vapor phase growth substrate according to claim 2, wherein the vapor phase growth layer of the semiconductor single crystal contains a nitride semiconductor.

4. A method for producing a silicon single crystal substrate for vapor phase growth,
   wherein a silicon single crystal ingot having a resistivity of 1000 Ωcm or more is manufactured by the FZ method, the ingot is sliced into wafers to form a silicon single crystal substrate, and the silicon single crystal substrate having a resistivity of 1000 Ωcm or more manufactured by the FZ method is subjected to RTA treatment in a nitrogen-containing gas atmosphere, to form a high nitrogen concentration layer having a nitrogen concentration higher than that of the bulk or back surface of the substrate and a nitrogen concentration of $5\times10^{15}$ atoms/$cm^3$ or more and a thickness of 10 to 100 μm at the surface of the silicon single crystal substrate, wherein the high nitrogen concentration layer is adjacent to the bulk.

5. A method for producing a vapor phase growth substrate, which comprises growing a semiconductor single crystal layer in vapor phase on the substrate for vapor phase growth produced by the method for producing a substrate for vapor phase growth according to claim 4.

6. The method for producing a vapor phase growth substrate according to claim 5, wherein the semiconductor single crystal layer contains a nitride semiconductor.

* * * * *